(12) United States Patent
Kinzer

(10) Patent No.: US 7,492,003 B2
(45) Date of Patent: Feb. 17, 2009

(54) SUPERJUNCTION POWER SEMICONDUCTOR DEVICE

(75) Inventor: Daniel M. Kinzer, El Segundo, CA (US)

(73) Assignee: Siliconix Technology C. V., Singapore (SG)

( * ) Notice: Subject to any disclaimer, the term of this patent is extended or adjusted under 35 U.S.C. 154(b) by 28 days.

(21) Appl. No.: 11/657,150

(22) Filed: Jan. 24, 2007

(65) Prior Publication Data
US 2007/0187750 A1    Aug. 16, 2007

Related U.S. Application Data

(60) Provisional application No. 60/761,701, filed on Jan. 24, 2006.

(51) Int. Cl.
H01L 29/76    (2006.01)

(52) U.S. Cl. .......... 257/328; 257/329; 257/341; 257/401; 257/E29.256; 257/E29.257

(58) Field of Classification Search .......... 257/328, 257/E29.256
See application file for complete search history.

(56) References Cited

U.S. PATENT DOCUMENTS

| | | | | |
|---|---|---|---|---|
| 5,365,085 | A * | 11/1994 | Tokura et al. .......... | 257/139 |
| 2003/0219933 | A1* | 11/2003 | Yamauchi et al. ...... | 438/156 |
| 2004/0150039 | A1* | 8/2004 | Henson .................. | 257/330 |
| 2005/0133859 | A1* | 6/2005 | Kuwahara et al. ...... | 257/328 |
| 2005/0221547 | A1* | 10/2005 | Yamauchi et al. ...... | 438/172 |

* cited by examiner

*Primary Examiner*—Tu-Tu V Ho

(57) ABSTRACT

A superjunction power semiconductor device which includes spaced drift regions each extending from the bottom of a respective gate trench to the substrate of the device.

7 Claims, 2 Drawing Sheets

SUPERJUNCTION POWER SEMICONDUCTOR DEVICE

RELATED APPLICATION

This application is based on and claims priority to the of U.S. Provisional Application Ser. No. 60/761,701, filed on Jan. 24, 2006, entitled Superjunction Device, to which a claim of priority is hereby made and the disclosure of which is incorporated by reference.

BACKGROUND OF THE INVENTION

The present invention relates to semiconductor devices and more particularly to power semiconductor switches that include a superjunction arrangement.

Superjunction MOSgated devices commonly comprise a plurality of spaced pillars or stripes of one of the conductivity types which extend perpendicularly into a silicon body of the other of the conductivity types that serves as the drift region. A MOSgate structure enables the connection of a source voltage to the pillars or stripes relative to the body, which is connected to a drain voltage. In a superjunction arrangement, the total charge in the pillars or stripes is at least approximately balanced by the charge in the surrounding silicon body. Thus, the body region and pillars or stripes are fully depleted in reverse bias to block reverse voltage. The concentration of dopants in the body may then be increased (decreasing its resistivity), as compared to that of the conventional MOSFET, so that during forward bias, the on resistance is reduced.

SUMMARY OF THE INVENTION

A semiconductor device according to the present invention includes a semiconductor substrate of one conductivity; an epitaxial semiconductor body of another conductivity on a surface of the substrate; a gate trench in the epitaxial semiconductor body; a drift region of the one conductivity extending from at least the bottom of the trench to the substrate and extending along only a portion of the sidewalls of the gate trench, the drift region of the one conductivity and the epitaxial semiconductor body being in charge balance; a source region of the one conductivity formed in the epitaxial semiconductor body adjacent the gate trench and spaced from the drift region of the one conductivity by an invertible channel region adjacent the trench; a source contact in ohmic contact with at least the source region; a drain contact in ohmic contact with the substrate.

In one embodiment of the present invention, the drift region extends into the substrate.

In another embodiment of the present invention, the drift region includes a high resistivity region adjacent the substrate and a low resistivity region adjacent the gate trench.

A device according to the present invention is particularly suitable midvoltage applications, for example, about 50 volts to 100 volts.

Other features and advantages of the present invention will become apparent from the following description of the invention which refers to the accompanying drawings.

DETAILED DESCRIPTION OF EMBODIMENTS OF THE INVENTION

Figure 1:
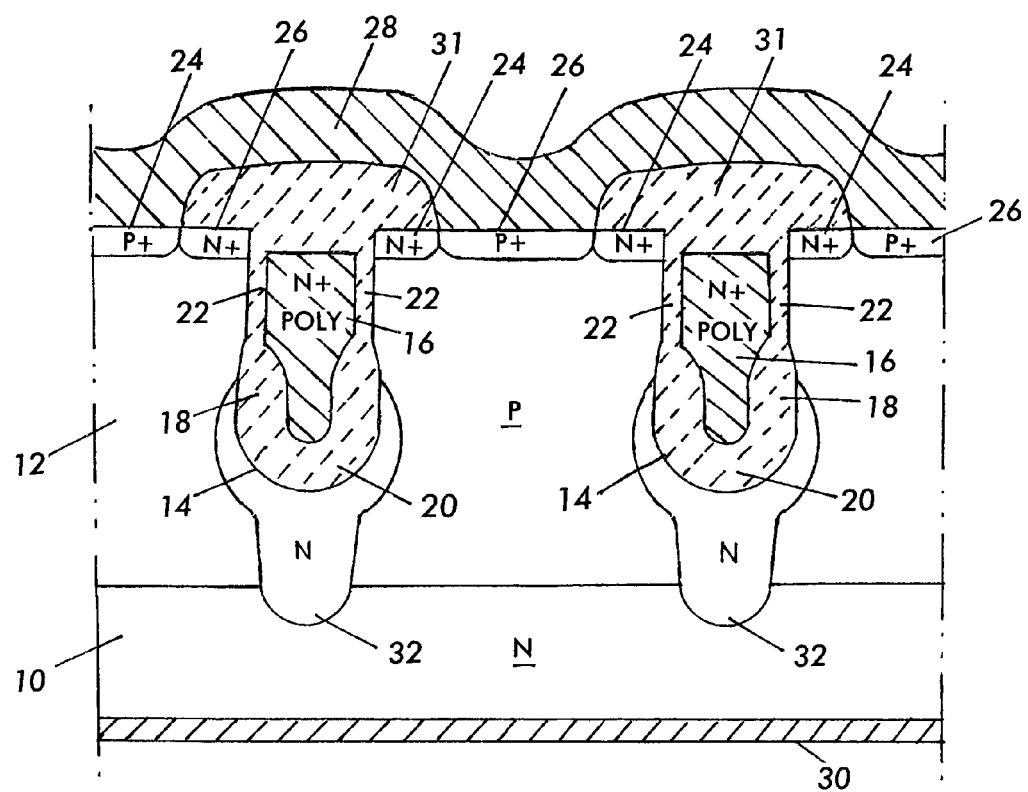
FIG. 1 shows a cross-sectional view of a portion of the active region of a power semiconductor device according to the first embodiment of the present invention.

Referring to FIG. 1, a power semiconductor device according to the first embodiment of the present invention, which is preferably a power MOSFET, includes a semiconductor substrate (e.g. silicon substrate) 10 of one conductivity (e.g. N-type) and an epitaxial semiconductor body 12 (i.e. a semiconductor body that is grown epitaxially) of another conductivity opposite to the one conductivity (e.g. P-type) formed on a surface of substrate 10. A plurality of spaced gate trenches 14 are formed in epitaxial semiconductor body 12 each for receiving a respective gate electrode 16 formed preferably with N-type polysilicon. Each gate electrode 16 is insulated from epitaxial body 12 by a respective oxide body 18 (e.g. $SiO_2$). Each oxide body 18 includes a thick oxide portion 20 residing adjacent the bottom and portions of the sidewalls of a respective trench and gate oxide portions 22 (thinner than the thick oxide portion) residing adjacent invertible channel regions in epitaxial body 12. Source regions 24 of the one conductivity type (e.g. N-type) are formed in epitaxial body 12 adjacent each gate trench and coupled ohmically to source contact 28 which may be formed with aluminum, aluminum silicon or the like material. Note that an oxide cap 31 insulates source contact 28 from a respective gate electrode 16. Source contact 28 is also ohmically coupled to high conductivity regions 26 of the another conductivity type (e.g. P-type), which are also formed in epitaxial body 12. High conductivity regions 26 are more conductive than epitaxial body 12 to provide for low contact resistance to source contact 28 as is well known. A device according to the first embodiment further includes drain contact 30 (formed with aluminum or aluminum silicon, for example) which is ohmically connected to substrate 10 opposite source contact 28.

According to one aspect of the present invention, a drift region 32 of the one conductivity (e.g. N-type) is formed (e.g. through implantation or the like step) in epitaxial body 12 and extends from the bottom of each gate trench 14 to at least substrate 10. Note that each drift region 32 also extends along the sidewalls of each trench until it reaches at least the invertible channel region (defined as the region adjacent each gate trench sidewall between a source region 24 and a drift region 32, which is inverted upon application of voltage to the nearest gate electrode 16) on each side of the trench. Each drift region 32 is in substantial charge balance with its surrounding (which is of opposite conductivity type) to realize the superjunction effect as described above. Preferably, a portion of each drift region 32 extends into substrate 10. Note that drift regions 32 are spaced and separated from one another by P-type regions of epitaxial body 12. That is, drift regions 32 are not coupled to one another directly, but only coupled through substrate 10. As a result, a substantial volume of epitaxial body 12 and the charge contained therein is preserved to realize the superjunction effect, while the volume occupied by drift regions 32 can be minimized even though the charge therein can be increased to improve the on-resistance of the device.

Note that in a device according to the present invention, drift regions 32 are formed in an epitaxial body 12. Thus, the conductivity of drift regions 32, which controls the on resistance of the device, can be controlled through proper selection of the implant concentration. On the other hand, in prior art superjunction devices, the drift region is epitaxially grown, and regions of opposite conductive are formed therein through implantation or the like process. Note also that in a device according to the first embodiment epitaxial body 12 serves as the channel region, thereby obviating the need for a channel region to be formed through implantation or the like process.

The topology of a device according to the first embodiment may be cellular or stripe and the cell pitch thereof may be about two microns. For a 75 volt device, epitaxial body 12 may be five microns thick. Note that all conductivity types may be reversed to produce a P channel device rather than the N channel device as described herein.

Figures 2, 3:
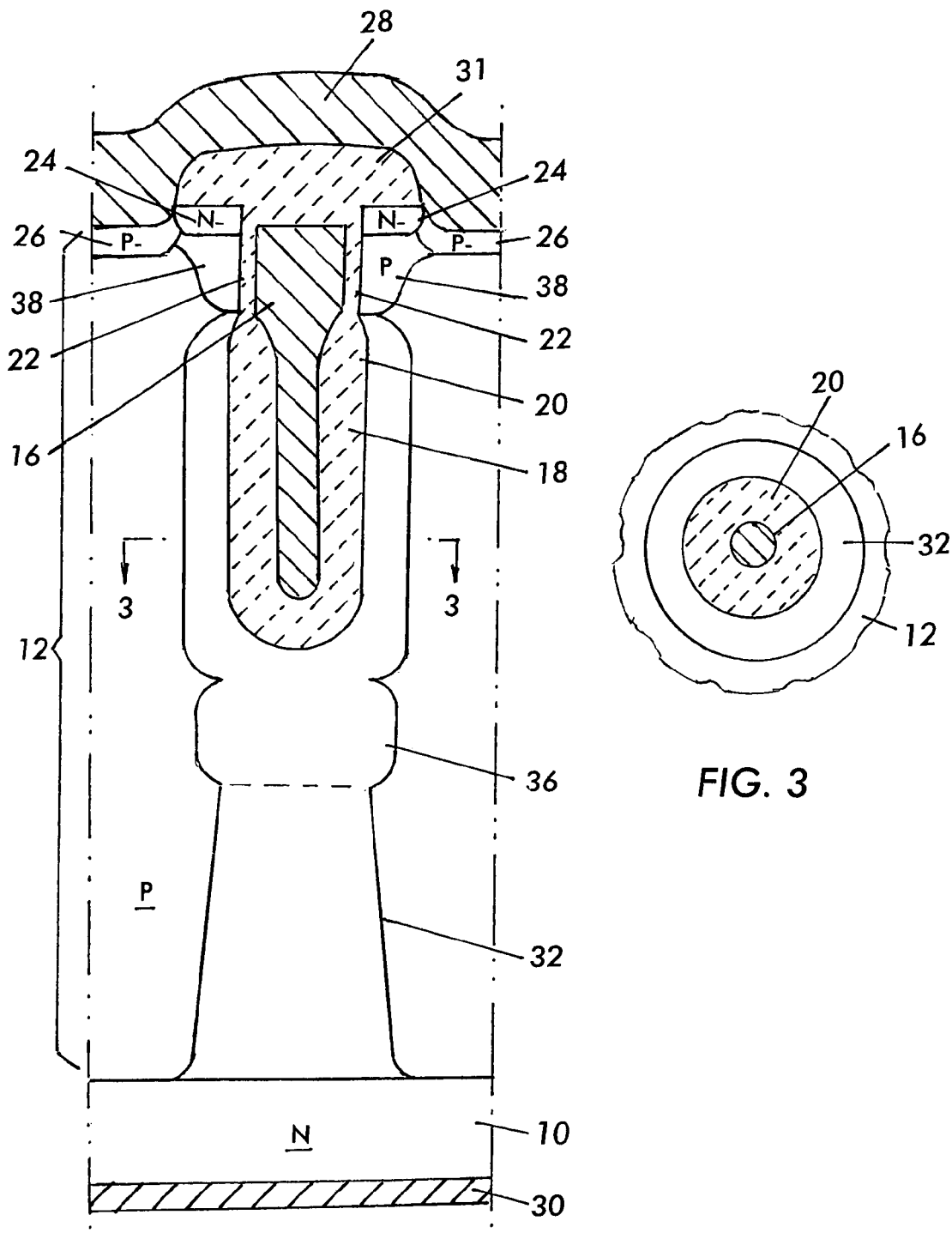
FIG. 2 shows a cross-sectional view of a portion of the active region of a power semiconductor device according to the second embodiment of the present invention.
FIG. 3 shows a cross-sectional view along line 3-3 in FIG. 2, viewed in the direction of the arrows.

Referring now to FIGS. 2 and 3, in which like numerals identify like features, in a device according to the second embodiment of the present invention, drift region 32 includes a high resistivity region 34 (e.g. 3 Kohms) adjacent substrate 10 and a low resistivity region 36 (e.g. 4 Kohms) adjacent trench 14. Similar to the first embodiment, drift region 32 extends from the invertible channel regions adjacent the gate oxides 22 to substrate 10. Note that a device according to the second embodiment further includes channel implants 38 of the another conductivity type (e.g. P-type) adjacent gate oxides 22 and each high conductivity region 26 includes a trench therein to improve the contact source contact 28 makes with high conductivity regions 26 and source regions 24. Note that channel implants 38 are spaced from one another by epitaxial body 12. Preferably, a device according to the second embodiment has a cellular topology as illustrated specifically by FIG. 3.

To obtain a 75 volt device using the arrangement of the second embodiment, epitaxial body 12 may be formed to have a resistivity of about 0.25 ohm cm, corresponding to a concentration of 6.5E16 atoms/cm$^2$ and high resistivity region 34 may be formed by arsenic implantation at a concentration of $1 \times 10^{17}$ atoms/cm$^3$.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
a semiconductor substrate of one conductivity;
an epitaxial semiconductor body of another conductivity on a surface of said substrate;
a gate trench in said epitaxial semiconductor body;
a drift region of said one conductivity extending from at least the bottom of said trench to said substrate and extending along only a portion of the sidewalls of said gate trench, said drift region of said one conductivity and said epitaxial semiconductor body being in charge balance;
a source region of said one conductivity formed in said epitaxial semiconductor body adjacent said gate trench and spaced from said drift region of said one conductivity by an invertible channel region adjacent said trench;
a source contact in ohmic contact with at least said source region; and
a drain contact in ohmic contact with said substrate, wherein said drift region includes a high resistivity region adjacent said substrate and a low resistivity region adjacent said gate trench.

2. The power semiconductor device of claim 1, wherein said drift region of said one conductivity extends into said substrate.

3. The power semiconductor body of claim 1, further comprising an oxide body disposed inside said trench, said oxide body including a gate oxide portion adjacent at least said invertible channel and a thick portion adjacent the drift region; and a gate electrode inside said trench and adjacent said oxide body.

4. The power semiconductor body of claim 1, further comprising a high conductivity region of said second conductivity formed in said epitaxial silicon body and making ohmic contact with said source contact.

5. The power semiconductor body of claim 3, wherein said gate electrode is comprised of polysilicon.

6. The power semiconductor body of claim 5, wherein said polysilicon is N type.

7. The power semiconductor body of claim 1, wherein said one conductivity type is N type and said another conductivity is P type.

* * * * *